United States Patent
Ichikawa et al.

(10) Patent No.: US 6,576,409 B2
(45) Date of Patent: Jun. 10, 2003

(54) PHOTOSENSITIVE RESIN COMPOSITION AND METHOD FOR FORMATION OF RESIST PATTERN BY USE THEREOF

(75) Inventors: Miyako Ichikawa, Sakado (JP); Masaki Sasaki, Asaka (JP); Teruo Saito, Iwatsuki (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 10/043,156

(22) Filed: Jan. 14, 2002

(65) Prior Publication Data
US 2002/0102501 A1 Aug. 1, 2002

Related U.S. Application Data

(62) Division of application No. 09/239,771, filed on Jan. 29, 1999, now Pat. No. 6,338,936.

(30) Foreign Application Priority Data

Feb. 2, 1998 (JP) .............................................. 10-33565
Jul. 10, 1998 (JP) ........................................... 10-210281

(51) Int. Cl.$^7$ ................................................ G03F 7/38
(52) U.S. Cl. ........................ 430/326; 430/330; 430/327
(58) Field of Search .............................. 430/327, 285.1, 430/280.1, 281.1, 287.1, 326, 330

(56) References Cited

U.S. PATENT DOCUMENTS

| | | | |
|---|---|---|---|
| 4,857,437 A | * 8/1989 | Banks et al. | 430/327 |
| 5,070,001 A | 12/1991 | Stahlhofen | 430/281.1 |
| 5,587,274 A | 12/1996 | Kishida et al. | 430/270.1 |
| 5,635,332 A | 6/1997 | Nakano et al. | 430/270.1 |
| 5,738,975 A | 4/1998 | Nakano et al. | 430/280.1 |
| 5,876,900 A | 3/1999 | Watanabe et al. | 430/288.1 |

FOREIGN PATENT DOCUMENTS

| | | |
|---|---|---|
| JP | 3-68376 | 10/1991 |
| JP | 5-218651 | 8/1993 |
| JP | 5-259649 | 10/1993 |
| JP | 5-343850 | 12/1993 |
| JP | 06295064 A | 10/1994 |
| JP | 07170073 A | 7/1995 |

* cited by examiner

Primary Examiner—Cynthia Hamilton
(74) Attorney, Agent, or Firm—Rader, Fishman & Grauer PLLC

(57) ABSTRACT

A photosensitive resin composition and a method of forming a positive resist pattern by the use of the composition are disclosed. The photosensitive resin composition comprises (A) a resinous compound containing an acid-decomposing ester group, (B) a compound containing one ethylenically unsaturated bond in its molecule and possessing a group capable of forming a carboxylic acid via decomposition by the action of an acid, (C) a photo-acid generator, (D) a photo-radical polymerization initiator, and optionally (E) an epoxy resin. When this composition is applied to a substrate, exposed to an active energy ray of a wavelength enough to activate the photo-radical polymerization initiator (D) and not enough to activate the photo-acid generator (C) to radically polymerize the compound (B), selectively irradiated with an active energy ray of a wavelength enough to activate the photo-acid generator (C) and heated, the resinous compound (A) and the polymer of the compound (B) is thermally decomposed by the catalytic action of the acid generated by the photo-acid generator (C), with the result that the selectively irradiated part of the coating film will be rendered soluble in an aqueous alkaline solution. A positive resist pattern is formed by removing the selectively irradiated part by development. When the composition contains the epoxy resin (E), the coating film may be thermally cured.

2 Claims, 1 Drawing Sheet

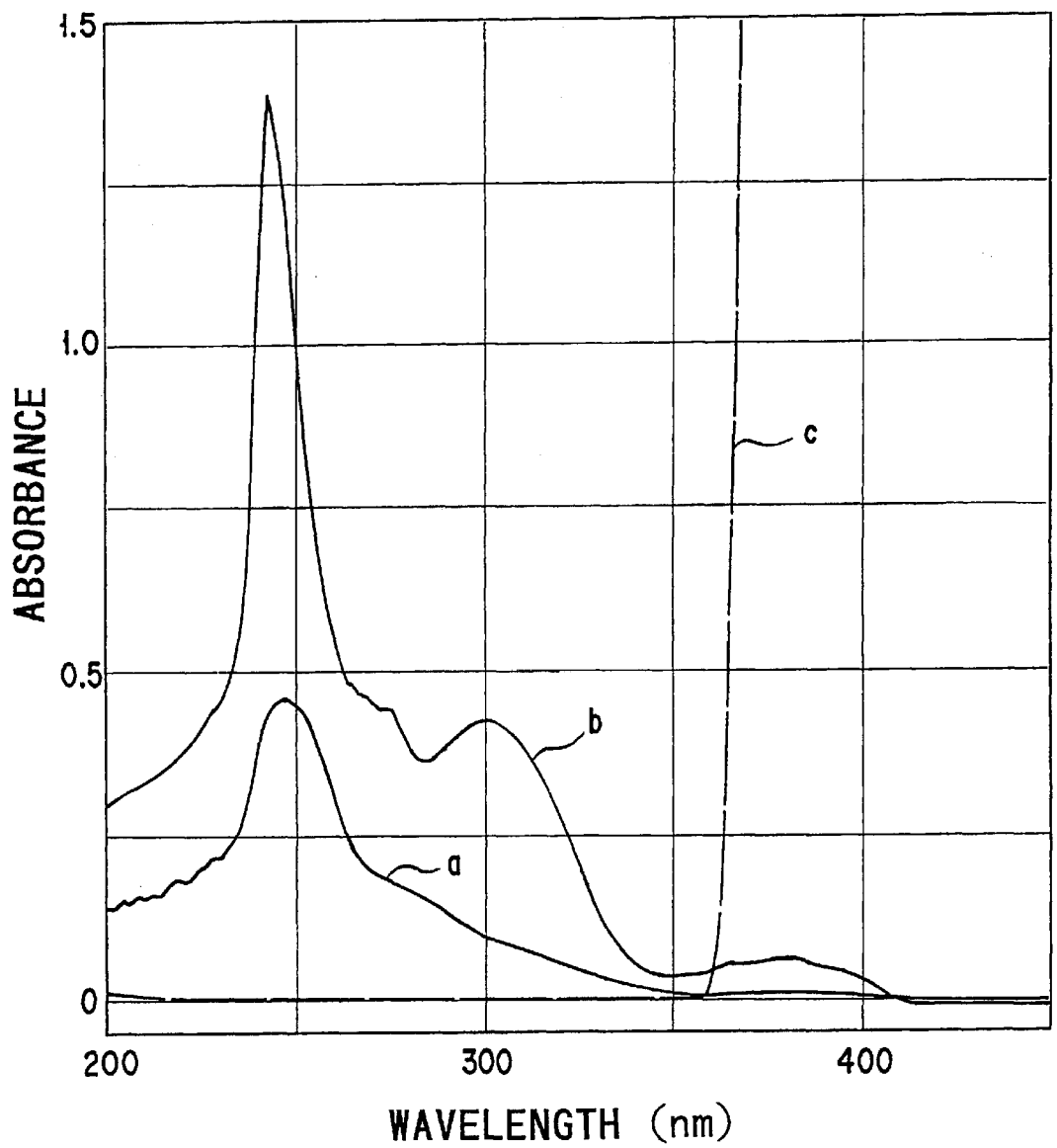

PHOTOSENSITIVE RESIN COMPOSITION AND METHOD FOR FORMATION OF RESIST PATTERN BY USE THEREOF

This is a division of U.S. application Ser. No. 09/239,771, filed Jan. 29, 1999, now U.S. Pat. No. 6,338,936 B1.

BACKGROUND OF THE INVENTION

1. Field of the Invention

This invention relates to a photosensitive material to be used in the production of semiconductors, the production of printed circuit boards, and the working of a metallic article and more particularly to a photosensitive resin composition which is destined to form an etching resist useful for metalworking as in the production of a printed circuit board and the production of the shadow mask for a cathode ray tube. This invention further relates to a photosensitive resin composition useful for the formation of a varying sort of resin adhesive layer, the formation of a resist film such as an etching resist or a solder resist in a printed circuit board, and particularly the formation of a resin insulating layer containing via holes in the production of a multi-layer printed circuit board. This invention also relates to a method for the formation of a resist pattern or a resin insulating pattern using the photosensitive resin composition, and more particularly to a method for forming a positive resist pattern or resin insulating pattern by exposing to an active energy ray or actinic radiation a layer of the composition applied to a substrate thereby giving rise to a tack-free coating film, without inducing evaporation of an organic solvent, then subjecting the coating film to selective exposure to an active energy ray shorter in wavelength than the active energy ray mentioned above and to a heat treatment, and thereafter developing the exposed coating film with an aqueous alkaline solution.

2. Description of the Prior Art

The etching resists which are used for the formation of circuit patterns in the production of printed circuit boards or for the metalworking are classified under the pattern printing type and the developing type. As the etching resist of the pattern printing type, the composition which has varnish as a main component thereof is used, which varnish being formed by dissolving a petroleum resin or a polycarboxylic acid resin in an organic solvent. When this etching resist is printed in a prescribed pattern on a substrate and then thermally dried, it forms a coating film which is capable of resisting the etching agents. The pattern printing, however, has the problem that it is incapable of forming a fine circuit the desirability of which has been finding growing recognition in recent years.

The etching resists of the developing type are classified under the dry film type and the liquid type. Each of these types is further classified by the kind of a peeling liquid or remover under the solvent peeling type and the alkali peeling type. However, the restriction imposed on the use of the solvent peeling type has been gaining in severity on account of the problem of environmental pollution.

As a photosensitive dry film of the alkali peeling type, the film of the composition which, as disclosed in Japanese Patent Publication No. 3-68,376, has an ethylenically unsaturated compound, a photopolymerization initiator, and a film-forming polymer as main components thereof has been known. Since this film, for the sake of maintaining due strength, requires to possess a thickness of not less than 25–50 $\mu$m, it exhibits the maximum attainable resolution of about 30 $\mu$m at most and, consequently, entails the problem of being unable to form a fine pattern with resolution higher than the level just mentioned.

As a photosensitive liquid resist of the alkali peeling type, the composition which comprises the varnish having a polycarboxylic acid resin dissolved in an organic solvent, an ethylenically unsaturated compound, and a photopolymerization initiator has been known. The liquid resist formed by applying the composition to a substrate is enabled to acquire such resolution as approximating closely to 10 $\mu$m by controlling the thickness of the applied layer of the composition. Since this composition requires liquefaction with an organic solvent, however, it has the problem of entailing environmental pollution.

The photosensitive resin compositions mentioned above are the negative type. When such a composition is adopted in the production of a multilayer printed circuit board, therefore, it inevitably poses the problem that the layer of the composition deposited on a substrate must be etched after the through holes formed in the substrate have been protected with a hole filling ink, for example. Specifically, the through holes in the substrate must be blocked up in advance with the hole filling ink because part of the layer of the photosensitive resin composition deposited on the substrate which has entered the through holes escapes being hardened even when the layer is exposed to light and the unhardened part of the composition, on being exposed to the action of development, flows out of the through holes. The hole filling ink which is a substance of the thermally drying type, however, has the problem that the thermal drying thereof consumes much time and the dried coating film of the ink fails to acquire fully satisfactory smoothness. In the field of the metalworking technology, the problem of inferior dimensional accuracy arises because the negative film of the composition to be used has a remarkably different thermal expansion coefficient from metal.

The adoption of a positive type photoresist, therefore, has been gaining in popularity in the formation of a circuit pattern on a printed circuit board or the fabrication of a shadow mask which demands accuracy.

In the positive type etching resists being developed at present, naphthoquinone diazide compounds are usually adopted as photosensitive substances. Since the naphthoquinone diazide compounds are expensive, their adoption is problematic in terms of cost. In the formation of a very fine pattern, they possibly offer no fully satisfactory resolving power.

Published Japanese Patent Application, KOKAI (Early Publication) No. (hereinafter referred to briefly as "JP-A-") 6-295,064 discloses the photosensitive composition which comprises a polymer containing a carboxyl group (polycarboxylic acid resin), a compound containing two or more vinyl ether groups in the molecule thereof, and a compound capable of generating an acid on exposure to an active energy ray. The coating film formed of this composition, when heated (primary heating), is insolubilized in a solvent or an aqueous alkali solution because the polycarboxylic acid resin is cross-linked by the addition reaction of the carboxyl group with the vinyl ether group. The insolubilized coating film, when further exposed to an active energy ray and then heated (secondary heating), the exposed part is again solubilized in the solvent or the aqueous alkali solution because the cross-linked structure is severed by the catalytic action of the acid generated in consequence of the exposure to the active energy ray. The resist pattern aimed at is formed by removing the exposed part by the developing treatment.

It may well be concluded that the composition which contains in combination the polycarboxylic acid resin, the multifunctional vinyl ether compound, and the compound capable of generating an acid on exposure to the active energy ray as mentioned above can basically answer the recent demand for the formation of very fine circuit patterns. Since this composition contains the multifunctional vinyl ether compound, however, it has the problem that the resist coating suffers the sensitivity and the resolving power thereof to be altered by the heating conditions and the like. Specifically, since the multifunctional vinyl ether compound which functions as a cross-linking agent for the polycarboxylic acid resin in the composition has high volatility, it is liable to volatilize during the course of the primary heating and change its content in the coating film. As a result, the composition has the problem that it fails to retain the sensitivity and the resolving power constant because the conversion of the carboxyl group and the vinyl ether group (the density of cross-linkage of the polycarboxylic acid resin) is varied by the conditions of the heating temperature, etc. Further, since the reaction of the carboxyl group with the multifunctional vinyl ether compound proceeds even at normal room temperature, the composition cannot be easily used unless it is prepared in the form of a two-component type composition. Thus, the composition is unfit for an etching resist. Further, the application of the composition of this nature to a substance poses the problem of polluting the environment because it requires use of an organic solvent.

Further, the recent rapid advance of semiconductor parts has been giving an impetus to the trend of electronic devices toward reduction in size and weight, exaltation of performance, and diversification of function and has been consequently directing printed circuit boards toward accelerated densification of patterned circuits. The demand for multilayer printed circuit boards has come to grow in concert with that for such high-density printed circuit boards. In the light of this trend, newer methods for the production of multilayer printed circuit boards have come to be proposed.

The conventional multilayer printed circuit board has been manufactured by a procedure which comprises superposing on the opposite surfaces of an inner-layer sheet having circuits formed thereon semi-cured prepreg sheets obtained in advance by impregnating such a substrate as glass cloth with a resin varnish and drying the wet substrate, further superposing thereon sequentially copper foils or copper-clad laminates as outer layers, for example, in the order mentioned, and simultaneously applying heat and pressure to the superposed layers by means of a multilayer-forming press in order to harden them, thereby completing a multilayer printed circuit board. Since this procedure requires the via holes intended to establish electric continuity between the component layers to be opened one by one with a drill or laser beam, it inevitably poses the problem of consuming an unduly long time and imposes a limit on the degree of densification of circuit patterns on account of the thickness of the prepreg and the diameter of the holes to be opened with a drill.

With a view to coping with this problem, the multilayer forming technology (build-up process) using a negative type liquid solder resist composition in the formation of an intermediate insulating layer has been proposed. Since this negative composition is a photo-setting type, the coating of the composition formed in a thickness necessary for the intermediate insulating layer cannot be fully photo-cured by one round of exposure to light. The technology, therefore, poses the problem of requiring a process of the steps of applying the composition, drying the applied layer of the composition, exposing the dried layer to light, and developing the exposed layer to be performed up to several repetitions in order for the applied layer to acquire a thickness necessary for the intermediate insulating layer. In this case, there are times when the additives such as a leveling agent contained in the resist induce the problem of ply separation. It also entails the problem that the organic solvent which has been used for liquefying the composition will be vaporized and diffused during the step of drying and consequently suffered to pollute the environment. The expulsion of the organic solvent results in inducing the dried applied layer to undergo volume shrinkage and rendering control of the thickness of the insulating layer of resin difficult.

In the circumstances, the process of thermally contact bonding a substrate containing a formed circuit and a copper foil through the medium of a layer of an alkali-soluble thermosetting resin composition, etching the surface copper foil exclusively in the parts thereof destined to be via holes, and thereafter dissolving the parts of the resin layer underlying the etched parts with an aqueous alkali solution thereby completing the via holes has been proposed (JP-A-5_218,651, JP-A-5-259,649, JP-A-5-343-850, and JP-A-7-170,073). The resin composition used in this process, however, produces a tack-free coating film by a procedure which comprises liquefying the alkali-soluble solid resin by dissolving the resin in an organic solvent, applying the liquefied resin to a copper foil or a printed circuit board containing a formed circuit, and thermally drying the applied layer of the resin. In this case, when the via holes are formed after the copper foil has been laminated and the coating film is thermally cured, there arises the problem that the organic solvent persisting in the resin composition vaporizes, generates bubbles, and causes separation between the copper foil and the layer of the resin composition. Further, the problem that the fine via holes cannot be formed with high accuracy ensues because the aqueous alkali solution does not exclusively dissolve the via hole parts and the aqueous alkali solution permeating through the via hole parts proceeds to dissolve the resin composition in the parts (peripheral walls) surrounding the via holes and impart a state of undercut to the resin composition.

SUMMARY OF THE INVENTION

A primary object of the present invention, therefore, is to provide a photosensitive resin composition which contains no organic solvent and, therefore, avoids inducing the otherwise possible evaporation of an organic solvent to cause environmental pollution or volume shrinkage of a dried coating film, and proves to be useful for the formation of a varying resin adhesive layer, the formation of the coating film of such a resist as etching resist or solder resist in a printed circuit board, and particularly the formation of a resin insulating layer containing via holes in the production of a multilayer printed circuit board.

A more specific object of the present invention is to provide a positive type photosensitive resin composition which, in the production of a multilayer printed circuit board by the copper foil laminating method, avoids posing the problem of suffering a residual organic solvent to cause separation of the copper foil during the course of thermal curing and, further owing to the positive quality of the composition, permits a tack-free coating film to be formed during the deposition of an insulating layer of a large thickness by collectively applying the composition in the form of a layer of a large thickness and then exposing the whole surface of the applied layer to light without requiring repetition of a procedure comprising the steps of application, drying, exposure to light, and development, and, as occasion demands, allows formation of via holes in the coating film of a large thickness by merely performing selective exposure to light, thermal treatment, and development exclusively in the parts assigned for the formation of via holes, and therefore proves to be usable as an intermediate insulating layer which is beneficial for the sake of forming stably shaped via holes without inducing ply separation.

A further object of the present invention is to provide a method which, in the field of production of a printed circuit board and metalworking, allows a positive resist pattern of high resolution to be formed stably at a low cost with high productivity.

Yet another object of the present invention is to provide a method which, in the impartation of a pattern to an intermediate insulating layer in a multilayer printed circuit board, permits formation of a tack-free coating film without entailing volume shrinkage by the irradiation with an active energy ray, i.e. a process having no possibility of diffusing a harmful organic solvent, and thereafter allows a resin insulating pattern excelling in such special qualities as heat resistance, electric insulation, and fastness of adhesion and possessing high resolution to be formed stably with satisfactory productivity by the selective exposure to an active energy ray having a shorter wavelength than the active energy ray mentioned above, heat treatment, development, and thermal curing.

To accomplish the objects mentioned above, the present invention provides a photosensitive resin composition characterized by comprising (A) a resinous compound containing an acid-decomposing ester group, (B) a compound containing one ethylenically unsaturated bond in its molecule and possessing a group capable of forming a carboxylic acid via decomposition by the action of an acid, (C) a compound capable of generating an acid on exposure to an active energy ray or actinic radiation (hereinafter referred to as "photo-acid generator"), and (D) a photo-radical polymerization initiator. Preferably the resinous compound (A) has a weight average molecular weight in the range of 500 to 40,000. Another preferable resinous compound has a weight average molecular weight in the range of 1,000 to 50,000.

In accordance with another aspect of the present invention, there is provided a photosensitive, thermosetting resin composition characterized by comprising (A) a resinous compound containing an acid-decomposing ester group and possessing a weight average molecular weight in the range of 500 to 40,000, (B) a compound containing one ethylenically unsaturated bond in its molecule and possessing a group capable of forming a carboxylic acid via decomposition by the action of an acid, (C) a photo-acid generator, (D) a photo-radical polymerization initiator, and (E) an epoxy resin.

The present invention further provides a method for forming a resist pattern or resin insulating pattern without involving a step for causing diffusion of a harmful organic solvent. This method is characterized by comprising a step of applying the photosensitive resin composition on a substrate, a primary exposure step of irradiating the coating film of the photosensitive resin composition with an active energy ray of a wavelength enough to activate the photo-radical polymerization initiator (D) and not enough to activate the photo-acid generator (C) thereby radically polymerizing the compound containing one ethylenically unsaturated bond in its molecule and possessing a group capable of forming a carboxylic acid via decomposition by the action of an acid (B) and consequently forming a tack-free coating film, a selective secondary exposure step of selectively irradiating the tack-free coating film with an active energy ray of a wavelength enough to activate the photo-acid generator (C) thereby decomposing the photo-acid generator (C) present in the irradiated part and forming an acid, a heating step of heating the coating film resulting from the selective secondary exposure step thereby decomposing the polymer containing an acid-decomposing ester group (A) and the radical polymer of the compound (B) mentioned above which are present in the part subjected to the selective secondary exposure and consequently rendering the coating film in that part soluble in an aqueous alkaline solution, and a step of developing the irradiated coating film with an aqueous alkaline solution thereby removing the part of the coating film subjected to the selective secondary exposure. Further, the present invention provides a method for forming a patterned resist or resin insulating layer excellent in heat resistance and insulating properties by thermally curing the resist pattern or resin insulating pattern formed as described above.

BRIEF DESCRIPTION OF THE DRAWING

The single FIGURE attached hereto is a graph showing examples of absorbance curves of a photo-acid generator and a photo-radical polymerization initiator and an example of cutoff wavelength of a filter.

DETAILED DESCRIPTION OF THE INVENTION

The photosensitive resin composition according to the present invention is characterized by containing in combination (A) a resinous compound possessing an acid-decomposing ester group, (B) a compound containing one ethylenically unsaturated bond in its molecule and possessing a group forming a carboxylic acid via decomposition by the action of an acid, (C) a photo-acid generator, and (D) a photo-radical polymerization initiator or further containing (E) an epoxy resin besides the components mentioned above in a combined state and is adapted to form a positive type resist pattern by elaborately combining a primary exposure step of preparatorily hardening a coating film of the composition and a selective secondary exposure-heating step of rendering only the selectively exposed part of the preparatorily hardened coating film soluble in an aqueous alkaline solution.

For a start, in the formation of the resist pattern, the entire surface of the coating film of the photosensitive resin composition applied on a substrate is exposed to an active energy ray of a wavelength enough to activate the photo-radical polymerization initiator (D) and not enough to activate the photo-acid generator (C), preferably an active energy ray having cut off by an optical filter the wavelength shorter than the threshold wave length ($\lambda$1) capable of activating the photo-acid generator (C) (primary exposure). The primary exposure only generates photo-radicals and radically polymerizes the compound possessing an ethylenically unsaturated bond (such as, for example, the aforementioned compound (B) possessing one ethylenically unsaturated bond in its molecule and containing a group forming a carboxylic acid via decomposition by the action of an acid). By this reaction, the tack-free coating film can be formed without entailing volume shrinkage and the control of the resin insulating layer in thickness can be rendered easy.

Further, by using the active energy ray of such a long wavelength, the coating film of a large thickness is enabled to acquire the ability to cure infallibly.

Even when the wavelength of the light absorbed by the photo-radical polymerization initiator (D) partly overlaps the wavelength of the light absorbed by the photo-acid generator (C), the active energy ray possessing the wavelength activating only the photo-radical polymerization initiator (D) can be used for the exposure through the medium of a filter possessing a proper cutoff wavelength, for example.

Now, this fact about the active energy ray will be described below by reference to the accompanying drawing.

In the diagram, the curve "a" represents an absorbance curve of triaryl sulfonium salt, a photo-acid generator (manufactured by Union Carbide Company and sold under the registered trademark of "CYRACURE" UVI-6950), the curve "b" represents an absorbance curve of a photo-radical polymerization initiator (manufactured by BASF and sold under the registered trademark of "Lucirin" TPO), and the curve "c" represents a cutoff wavelength of a filter. While the maximum wavelength of the light that can be absorbed by the photo-radical polymerization initiator is not less than about 50 nm larger than the maximum wavelength of the light that can be absorbed by the photo-acid generator as illustrated in the diagram, the greater parts of the absorbance curves "a" and "b" overlap each other. The photo-radical polymerization initiator can be exclusively activated by utilizing a filter possessing a proper cutoff wavelength, however, so long as the maximum wavelengths (or minimum wavelengths) capable of absorbing the lights of these compounds have a slight difference, preferably a difference of not less than about 50 nm. In the illustrated case, for example, when the coating film is exposed to the light from a light source of a wavelength in the ultraviolet-near infrared region through a filter having a cutoff wavelength of about 365 nm and allowing no passage of a light of a shorter wavelength (curve "c"), only the photo-radical polymerization initiator is enabled to effect radical polymerization of the compound (B) possessing the ethylenically unsaturated bond because it is activated by absorbing the light of a wavelength of about 365–400 nm and enabled to emit radicals.

The threshold wavelength ($\lambda 1$) which is capable of activating the photo-acid generator (UVI-6950), for example, in the actual composition does not always coincide with the absorption spectrum of the photo-acid generator itself (the maximum wavelength about 350 nm in the illustrated case) because it is affected by the presence of other sensitizing compound and it is not allowed to effect the activation when the absorption energy is unduly weak. The expression "threshold wavelength ($\lambda 1$) capable of activating a specific compound" as used in the present specification means the maximum wavelength (or minimum wavelength) that can activate the specific compound in a given composition. This threshold wavelength ($\lambda 1$) regarding the photo-radical polymerization initiator (D) refers to the maximum wavelength (or minimum wavelength) which allows no incomplete development when the layer of the photosensitive resin composition is exposed in the entire surface thereof to the active energy ray through a varying filter. The threshold wavelength regarding the photo-acid generator (C) is found from the maximum wavelength (or minimum wavelength) capable of development which is determined by applying to a substrate a composition comprising (A) the polymer possessing an acid-decomposing ester group, (C) the photo-acid generator, and an organic solvent, drying the applied layer of the composition, and continuously measuring the sensitivity of the coating film to the monochromatic light by the use of a spectral sensitivity measuring device.

Generally, the photo-acid generator (C) and the photo-radical polymerization initiator (D) constitute a combination such that the threshold wavelength ($\lambda 1$) for activating the photo-acid generator is shorter than the threshold wavelength for activating the photo-radical polymerization initiator. In the case of this combination, the photo-radical polymerization initiator is preferred to be activated by an active energy ray of a wavelength not less than 50 nm longer than the threshold wavelength ($\lambda 1$) for activating the photo-acid generator mentioned above. Recently, a photo-acid generator having an absorption spectrum in the visible region has been available on the market. When the photo-acid generator of this sort is adopted, the photo-radical polymerization initiator can be exclusively activated by using this generator in combination with a photo-radical polymerization initiator possessing an absorption spectrum exclusively in the ultraviolet region, for example, and using a light source capable of emitting the ultraviolet light exclusively or using a filter incapable of permeating the light in the visible ray region. In this case, the threshold wavelength for selecting the cutoff wavelength of the filter is determined on the basis of the minimum wavelength capable of activating the photo-acid generator. The selective secondary exposure step can be carried out by using a visible light source.

By subjecting the coating film of the photosensitive resin composition to the primary exposure step as described above, it is made possible to effect exclusive generation of photo-radicals, permit radical polymerization of the compound (B) possessing an ethylenically unsaturated bond, form a tack-free coating film, and enable the contact exposure to be performed at the subsequent secondary exposure step. The coating film formed of this photosensitive resin composition is insoluble in an aqueous alkaline solution because the polymer (A) possessing the acid-decomposing ester group contains no free acid.

Subsequently, the second exposure step of selectively irradiating the tack-free coating film with an active energy ray of a wavelength of not more than $\lambda 1$, for example, is carried out through a photomask bearing a prescribed exposure pattern (secondary selective irradiation). The light source to be used for this selective secondary exposure step does not need to be limited to a light source capable of emitting exclusively an active energy ray of a wavelength lower than the threshold wavelength ($\lambda 1$) of the photo-acid generator (C) but requires only to be capable of emitting an active energy ray containing a light of a wavelength capable of activating the photo-acid generator. By the exposure to the active energy ray at the selective secondary exposure step, the photo-acid generator is allowed to react and effect selective generation of an acid exclusively in the irradiated part. Then, by heat-treating the coating film at about 60° C. to about 120° C. for about 5 to about 30 minutes, preferably at about 70° C. to about 100° C. for about 10 to about 20 minutes, the acid mentioned above manifests a catalytic activity and, selectively in the part subjected to the secondary selective irradiation (the part having generated the acid), effects decomposition of the polymer (A) possessing the acid-decomposing ester group and the polymer of the compound (B) which has been photo-radically polymerized by the primary irradiation mentioned above, with the result that these polymers will be converted into polymers which possess a free acid and thus exhibit solubility to an aqueous alkaline solution. The part of the coating film which has been subjected to the secondary selective irradiation, therefore, can be easily dissolved and removed by the development with an aqueous alkaline solution. As a result, the coating film is enabled to maintain high sensitivity and high resolution and allowed to form a positive resist pattern stably because the conditions of the heat treatment performed during the course of the formation of the film do not affect sensitivity or resolution.

Further, in the case of the composition which additionally contains the epoxy resin (E), the coating film which has formed a resist pattern as described above is heat-treated at about 140° C. to about 180° C. for about 15 to about 60 minutes. Consequently, the photo-acid generator (C) present in the part of the coating film which has escaped being subjected to the secondary selective irradiation is thermally decomposed and, by the catalytic action of the acid generated in consequence of the thermal decomposition, the acid generated by the decomposition of the resinous compound (A) possessing an acid-decomposing ester group and the acid generated by the decomposition of the polymer of the compound (B) which has been cationically polymerized by the primary irradiation mentioned above or further the acid generated by the thermal decomposition of the acid-decomposing ester group itself undergo a cross-linking reaction with the epoxy resin and form a patterned resin insulating film possessing heat resistance and electrical insulation properties.

As concrete examples of the resinous compound (A) containing an acid-decomposing ester group, t-butoxycarbonyl ester group-containing resinous compounds derived from phenol novolak resins or polymers of vinyl phenols, resinous compounds of (meth)acrylic acid-t-butyl esters, and resinous compounds formed by addition of monovinyl ether to resins containing a carboxyl group and/or a phenolic hydroxyl group may be cited. Preferably, resins obtained by causing a monovinyl ether compound to react with an alkali-soluble resin (polycarboxylic acid resin, polyphenolic resin) containing a carboxyl group and/or a phenolic hydroxyl group and possessing an acid value of the solid content in the range of 60 to 600 mg KOH/g, preferably 60 to 300 mg KOH/g.

When the photosensitive resin composition is used in preparing a solder resist in a printed circuit board or a resin insulating layer in a multilayer printed circuit board, it is desirable that it should contain the resinous compound (A) possessing an acid-decomposing ester group and having a weight average molecular weight in the range of 500 to 40,000. When the photosensitive resin composition is used in preparing an etching resist, it may contain the resinous compound (A) possessing an acid-decomposing ester group and having a weight average molecular weight in the range of 1,000 to 50,000. If the resinous compound (A) containing an acid-decomposing ester group has a weight average molecular weight lower than the lower limit mentioned above, the coating film to be produced will be at a disadvantage in exhibiting unduly low strength and acquiring degraded qualities after thermal curing. Conversely, if the weight average molecular weight exceeds the upper limit mentioned above, the produced coating film will be at a disadvantage in being developed with an aqueous alkaline solution only with difficulty.

As the alkali-soluble resin, a resin resulting from the copolymerization of 8 to 40% by weight of (meth)acrylic acid with other monomer is used in one preferred embodiment of the present invention. The term "(meth)acrylic acid" as used in this specification means acrylic acid, methacrylic acid or a mixture thereof. As concrete examples of the other monomer to be used for the copolymerization, styrene, chlorostyrene, α-methylstyrene, vinyl phenol; acrylates, methacrylates, and fumarates containing methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl as substituents; monoacrylates or monomethacrylates of polyethylene glycol or monoacrylates or monomethacrylates of polypropylene glycol; vinyl acetate, vinyl butyrate, or vinyl benzoate; olefins such as ethylene and propylene; and acrylonitrile may be cited.

If the weight average molecular weight of the aforementioned copolymer resin as the starting material for the resinous compound (A) is less than 1,000, the shortage will entail such disadvantages as rendering the control of the molecular weight at the time of synthesis difficult, lowering the strength of the coating film of the resinous compound (A) derived from the copolymer resin, and degrading the special qualities of the coating film after thermal curing. Conversely, if the weight average molecular weight exceeds 40,000, the excess will bring the disadvantage of rendering the development with an aqueous alkaline solution difficult.

If the acid value of the copolymer resin as the starting material of the resinous compound (A) is less than 60 mg KOH/g, the shortage will render difficult the development of the part of the coating film irradiated with the active energy ray (part subjected to the secondary selective irradiation) with an aqueous alkaline solution because the polycarboxylic acid resin formed by the decomposition of the polymer due to the irradiation of the active energy ray and the application of heat is proportionately low. Conversely, if the acid value exceeds 300 mg KOH/g, the excess will raise the viscosity of the copolymer resin and render the synthesis difficult consequently. The excess will also pose the problem that the influence of steric hindrance prevent the ratio of addition of a monovinyl ether to the copolymer resin from increasing.

As other favorable examples of the alkali-soluble resin mentioned above, polymers of vinyl phenol, phenolic resins, and alkyl phenolic resins may be cited. Phenol novolak resins and/or cresol novolak resins are more preferred examples. Further, such resins as are formed by the partial addition of a dicarboxylic anhydride to phenolic resins are usable.

If the weight average molecular weight of the polyphenolic resin as the starting material for the resinous compound (A) is less than 500, the shortage will bring such disadvantages as lowering the strength of the coating film of the resinous compound (A) to be derived and also degrading the special qualities after the thermal curing. Conversely, if the weight average molecular weight exceeds 20,000, the excess will bring the disadvantage of rendering the development with an aqueous alkaline solution difficulty.

If the acid value of the phenol novolak resin and/or the cresol novolak resin as the starting material for the resinous compound (A) is less than 200 mg KOH/g, the development of the part of the coating film irradiated with the active energy ray (the part subjected to the secondary selective irradiation) will be attained only with difficulty because the polyphenolic resin formed by the decomposition of the polymer due to the irradiation of the active energy ray and the application of heat is proportionately low. Conversely, if the acid value exceeds 600 mg KOH/g, the excess will bring the disadvantages of raising the viscosity of the polyphenolic resin, rendering the increase of the ratio of addition of a monovinyl ether to the polyphenolic resin difficult owing to the influence of steric hindrance, and, even during the course of thermal curing, suffering persistence of an unaltered phenolic hydroxyl group and degrading the electrical properties owing to the steric hindrance.

As concrete examples of the monovinyl ether compound to be subjected to the addition reaction to the alkali-soluble resin mentioned above, vinyl methyl ether, vinyl ethyl ether, vinyl isopropyl ether, vinyl n-propyl ether, vinyl isobutyl ether, vinyl n-butyl ether, vinyl t-butyl ether, vinyl n-amyl ether, vinyl isoamyl ether, vinyl n-octadecyl ether, ethylene glycol butyl vinyl ether, and triethylene glycol methyl vinyl ether may be cited. The monovinyl ether compounds which have boiling points in the range of 30° to 200° C. prove to be particularly advantageous. If the boiling point of the monovinyl ether compound is lower than 30° C., the addition reaction of the compound to the polycarboxylic acid resin and/or polyphenolic resin during the synthesis of the resinous compound (A) mentioned above will become difficult. Conversely, if the boiling point exceeds 200° C., the excess gives rise to the disadvantage that the monovinyl ether compound formed by the thermal decomposition of the resinous compound (A) during the heat-treatment of the coating film will undergo a reversible reaction of being readded to the polycarboxylic acid resin and/or polyphenolic resin which is similarly formed during the course of the heat treatment and the part of the coating film exposed to the active energy ray will not be easily developed with an aqueous alkaline solution.

The monovinyl ether compound mentioned above reacts with the polycarboxylic acid resin and/or polyphenolic resin in a suitable solvent at a temperature in the range of from room temperature to 100° C. to produce the resinous compound (A) mentioned above. This reaction of synthesis proceeds in the absence of a catalyst. It may be performed, when necessary, in the presence of a trace amount of an acid catalyst or a phase-transfer catalyst. The ratio of addition of the monovinyl ether compound to the carboxyl groups and/or phenolic hydroxyl groups is preferred to be not less than 50%, preferably not less than 90%. If the ratio of addition is less than 50%, the shortage entails the disadvantage that the part of the coating film which has escaped being subjected to the secondary selective irradiation with the active energy ray will be deficient in resistance to the development with the aqueous alkaline solution and the coating film will not easily form a fully satisfactory pattern. In consideration of the thermal stability of the resinous compound (A) to be obtained, since the free carboxylic acid functions as a decomposition catalyst, the ratio of addition of the monovinyl ether is preferred to be increased above 90%.

As the compound (B) containing one ethylenically unsaturated bond in its molecule and possessing a group capable of forming a carboxylic acid via decomposition by the action of an acid, a (meth)acrylic ester containing a group represented by the following general formula (1):

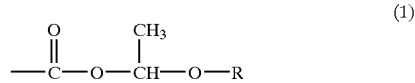

(1)

wherein R represents an alkyl group of 1–18 carbon atoms or a group resulting from the substitution of the hydrogen atom of the alkyl group by an alkoxyl group of 1–6 carbon atoms, or a t-butyl (meth)acrylate may be preferably used.

As concrete examples of the (meth)acrylic ester containing a group represented by the general formula (1) mentioned above, such compounds as are obtained by the addition of (b) a monovinyl ether to (a) carboxyl group-containing unsaturated compounds may be cited.

As concrete examples of (a) the carboxyl group-containing unsaturated compound, (meth)acrylic acid and other compounds which are obtained by the addition of polybasic anhydrides to (meth)acrylates containing a hydroxyl group, such as mono(2-acryloyloxyethyl) succinic acid, mono(2-acryloyloxyethyl) phthalic acid, mono(2-acryloyloxyethyl) hexahydrophthalic acid, mono(2-acryloyloxypropyl) succinic acid, mono(2-acryloyloxypropyl) phthalic acid, mono(2-acryloyloxypropyl) hexahydroxyphthalic acid, mono(2-methacryloyloxyethyl) succinic acid, mono(2-methacryloyloxyethyl) phthalic acid, mono(2-methacryloyloxyethyl) hexahydrophthalic acid, mono(2-methacryloyloxypropyl) succinic acid, mono(2-methacryloyloxypropyl) phthalic acid, and mono(2-methacryloyloxypropyl) hexahydrophthalic acid may be cited. The term "(meth)acrylate" as used in this specification means acrylate, methacrylate or a mixture thereof.

As concrete examples of the monovinyl ether (b) mentioned above, vinyl methyl ether, vinyl ethyl ether, vinyl isopropyl ether, vinyl n-propyl ether, vinyl isobutyl ether, vinyl n-butyl ether, vinyl t-butyl ether, vinyl isoamyl ether, vinyl n-amyl ether, vinyl n-hexyl ether, vinyl cyclohexyl ether, vinyl n-octadecyl ether, ethylene glycol butyl vinyl ether, and triethylene glycol methyl vinyl ether may be cited.

These compounds (B) may be used either singly or in the form of a combination of two or more members.

A compound containing one ethylenically unsaturated bond in its molecule which is copolymerizable with the compound (B) may be added to the composition in an amount such that the copolymer formed by the irradiation of the active energy ray (primary irradiation) may not have the lower solubility in an aqueous alkaline solution, specifically such that the acid value assumed by the copolymer when it is decomposed by the action of an acid may be not less than 80 mg KOH/g. When this compound possesses high volatility, however, the addition thereof is not advantageous because this compound is prone to cause environmental pollution. As concrete examples of such a compound possessing one ethylenically unsaturated bond in its molecule, styrene, chlorostyrene, α-methylstyrene; acrylates, methacrylates, and fumarates containing methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, ethoxyethyl, butoxyethyl, 2-hydroxyethyl, 2-hydroxypropyl, 3-chloro-2-hydroxypropyl, phenoxyethyl, phenoxy-ethoxyethyl, acetyloxy ethyl as substituents; monoacrylates or monomethacrylates of polyethylene glycol or monoacrylates or monomethacrylates of polypropylene glycol; vinyl acetate, vinyl butyrate, or vinyl benzoate; olefins such as ethylene and propylene; and acrylonitrile may be cited.

Preferably, the compound (B) mentioned above and the compound containing one ethylenically unsaturated bond in its molecule may be used in a total amount in the range of 50 to 400 parts by weight, based on 100 parts by weight of the resinous compound (A) mentioned above. These compounds are the components which are necessary for the sake of liquefying the photosensitive resin composition of the present invention. If the total amount of these compounds is less than the lower limit of the range mentioned above, the shortage will bring the disadvantage of raising the viscosity of the composition to the extent of preventing the composition from acquiring necessary printability and leveling property. If the total amount exceeds the upper limit of the range, the excess will bring the disadvantages of degrading the photo-curing property of the composition and disabling the formation of a tack-free coating film.

As concrete examples of the aforementioned photo-acid generator (C) to be used herein, various cationic polymerization initiators such as diazonium salt, iodonium salt, bromonium salt, chloronium salt, sulfonium salt, selenonium salt, pyrilium salt, thiapyrilium salt, pyridinium salt, and ferrosenium salt; halogenated compounds such as tris (trihalomethyl)-s-triazine and derivatives thereof; 2-nitrobenzyl esters of sulfonic acid; iminosulfonates; 1-oxo-2-diazonaphthoquinone-4-sulfonate derivatives; N-hydroxyimide=sulfonates; tri(methane sulfonyloxy) benzene derivatives; bissulfonyl diazomethanes; sulfonylcarbonyl alkanes; sulfonylcarbonyl diazo methanes; and disulfone compounds may be cited. The various cationic polymerization initiators are usable when the epoxy resin (E) to be used is a finely divided epoxy resin which is sparingly soluble in an organic solvent. When the epoxy resin is an epoxy resin containing no aromatic ring, such as alicyclic epoxy resins, however, they are not used advantageously because they are apt to induce cationic polymerization and degrade the developing properties. The halogenated compounds such as tris (trihalomethyl)-s-triazine and derivatives thereof must be used attentively because the hydrogen halogenide consequently generated by these compounds possibly gasifies during the course of the heat treatment subsequent to the irradiation of an active energy ray (secondary selective irradiation) and degrades the resistance of the unirradiated part to the action of the development. Under the circumstances, 2-nitrobenzyl esters of sulfonic acid; iminosulfonates; 1-oxo-2-diazonaphthoquinone-4-sulfonate derivatives; N-hydroxyimide=sulfonates; tri(methane sulfonyloxy) benzene derivatives; bissulfonyl diazo methanes; sulfonylcarbonyl alkanes; sulfonylcarbonyl diazomethanes; and disulfone compounds which generate an involatile sulfonic acid prove to be favorable.

As concrete examples of the photo-acid generator (C) which is available on the market, triaryl sulfonium salts such as CYRACURE (registered trademark) UVI-6950 and UVI-6970 manufactured by Union Carbide Compnay, Optomer SP-150, SP-151, SP-152, SP-170, and SP-171 manufactured by Asahi Denka Kogyo K.K., CI-2855 manufactured by Nippon Soda Co., Ltd., and Degacere KI 85 B manufactured by Degussa Corp, ferrocenium salts such as Irgacure 261 manufactured by Ciba Specialty Chemicals Company, unsubstituted or substituted aryl diazonium salts, and diaryliodonium salts; tris(trichloromethyl)-s-triazines and derivatives thereof such as S-Triazine, TTC-Triazine, TFE-Triazine, and Triazine A manufactured by Sanwa Chemical Co., Ltd.; and sulfonic acid generators such as Benzointosilate MBZ-101, PYR-100, SI-100, SI-101, SI-105, PI-105, NDI-105, NAI-101, NAI-105, NAI-106, PAI-101, and DS-101 manufactured by Midori Kagaku K.K. may be cited.

The ratio of addition of the photo-acid generator (C) is proper in the range of 2 to 40 parts by weight to 100 parts by weight of the resinous compound (A) mentioned above. If the ratio is smaller than the lower limit of the range mentioned above, the shortage will bring the disadvantages of decreasing the amount of the acid to be formed by the irradiation of the active energy ray and disabling the formation of a pattern. Conversely, if the ratio is larger than the upper limit of the range mentioned above, the excess will be at a disadvantage in tending to degrade the sensitivity of the coating film owing to the absorption of light by the compounds themselves.

Examples of the photo-radical polymerization initiators (D) mentioned above include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1-hydroxy-cyclohexyl. phenyl ketone; aminoacetophenones such as 2-methyl-1-[4-(methylthio)phenyl]-2-morpholinopropan-1-one, 2-benzyl-2-dimethylamino-1-(4-morpholinophenyl)-butan-1-one; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; and xanthones. These well known and widely used photo-radical polymerization initiators may be used either singly or in the form of a combination of two or more members. Optionally such a photo-radical polymerization initiator (D) may be used in combination with one or more well-known conventional photosensitizers such as tertiary amines like N,N-(dimethylamino)ethylbenzoate, N,N-(dimethylamino)isoamyl benzoate, penthyl-4-dimethylaminobenzoate, triethyl amine, and triethanol amine.

Preferably, a photo-radical polymerization initiator and a photo-acid generator to be used are so combined that the wavelength for activating one or a combination of two or more photo-radical polymerization initiators (D) may be longer than the threshold wavelength ($\lambda 1$) for activating the photo-acid generator (C) mentioned above. More preferably, the photo-radical polymerization initiator to be used in the combination under discussion is activated by an active energy ray of a wavelength not less than 50 nm longer than the threshold wavelength ($\lambda 1$) mentioned above.

Preferably, the ratio of addition of the photo-radical polymerization initiator (D) (when it is used in combination with a photosensitizer, the total amount of the initiator and the photosensitizer) is in the range of 2 to 30 parts by weight to 100 parts by weight of the total amount of the compound (B) and the compound containing one ethylenically saturated bond in its molecular mentioned above. If the ratio is smaller than the lower limit of the range mentioned above, the shortage will bring the disadvantage of degrading the photo-curing properties of the composition and the solubility of the composition in an aqueous alkaline solution. Conversely, if the ratio is larger than the upper limit of the range mentioned above, the excess will bring the disadvantage of degrading the sensitivity of the coating film in consequence of the absorption of light by these compounds themselves.

As the epoxy resin (E) mentioned above, various well-known and popularly adopted epoxy resins including typically glycidyl ether compounds such as bisphenol A epoxy resin, bisphenol F epoxy resin, bisphenol S epoxy resin, brominated bisphenol A epoxy resin, hydrogenated bisphenol A epoxy resin, biphenol epoxy resin, bixylenol epoxy resin, phenol novolak epoxy resin, cresol novolak epoxy resin, brominated phenol novolak epoxy resin, and novolak epoxy resin of bisphenol A; glycidyl ester compounds such as terephthalic diglycidyl ester, hexahydrophthalic diglycidyl ester, and dimeric diglycidyl ester; and glycidyl amine compounds such as triglycidyl isocyanurate, N,N,N',N'-tetraglycidyl methaxylene diamine, N,N,N',N'-tetraglycidyl bis(aminomethyl)-cyclohexane, and N,N-diglycidyl aniline may be used. The glycidyl amine compound, however, is not preferred to be used in a large amount because it is disposed to adsorb the acid which is generated from the photo-acid generator (C) in consequence of the irradiation of the active energy ray. The epoxy resins may be used either singly or in the form of a combination of two or more members. In a preferred embodiment, the powdered epoxy resin, such as triglycidyl isocyanurate or bixylenol glycidyl ether, which is sparingly soluble in an organic solvent is contained in the whole combination of epoxy resins in an amount of not less than 20% by weight. If the ratio of the powdered epoxy resin is unduly small, there will arise the possibility of the developing properties of the coating layer being degraded by the viscosity and the hydrophilicity of the epoxy resin. Depending on the kind of the photo-acid generator (C) mentioned above, the epoxy resin possibly succumbs to photo-cationic polymerization and further degrades the developing properties of the coating film.

Preferably from the viewpoint of such special qualities of the coating film as heat resistance, electrical insulation properties, and adhesiveness with copper foil after the thermal curing, the ratio of incorporation of the epoxy resin (E) is in the range of 0.6 to 1.8 equivalent weights based on the acid to be derived from the resinous compound (A) and the compound (B) mentioned above.

The photosensitive resin composition of the present invention is allowed to incorporate therein such well known and popularly used inorganic fillers as barium sulfate, talc, silica, and aluminum oxide for the purpose of improving such properties of the coating film as fastness of adhesion, hardness, and resistance to the heat of soldering. Such basic inorganic fillers as aluminum hydroxide are not appropriate because they neutralize the acid to be generated from the photo-acid generator in consequence of the exposure to the active energy ray. The amount of the inorganic filler to be properly used is not more than 100 parts by weight, preferably in the range of 5 to 50 parts by weight, based on 100 parts by weight of the resinous compound (A) mentioned above. If this amount exceeds the upper limit of the range mentioned above, the excess entails the disadvantage that the strength and the sensitivity of the coating film will be lowered.

The photosensitive resin composition of the present invention, when necessary, can incorporate therein such well known and popularly used additives as a coloring pigment, a coloring dye, a thermal polymerization inhibitor, a thickener, an anti-foaming agent, a leveling agent, and a coupling agent.

It can further incorporate therein, when necessary for the purpose of enhancing sensitivity, sensitizing dyestuffs of the phenothiazine type, anthracene type, coronene type, benzanthracene type, perylene type, pyrene type, merocyanine type, ketocoumarin type, and thioxanthon type.

The photosensitive resin composition of the present invention, when necessary, is further allowed to incorporate therein an imidazole salt, a boron trifluoride complex, or an organic metal salt as a latent curing catalyst. It is further allowed to incorporate therein such compounds as adenine, vinyl triazine, dicyandiamide, orthotolyl biguanide, and melamine, or the salts thereof for the purpose of preventing the copper component, i.e. the circuit, on the printed circuit board from oxidation. Since they are prone to adsorb the acid generated from the photo-acid generator (C) mentioned above, they are not preferred to be added in an unduly large amount. The ratio of incorporation of these compounds is not more than 20 parts by weight to 100 parts by weight of the resinous compound (A) mentioned above. The addition thereof results in enabling the cured coating film to acquire improved chemical resistance and fastness of adhesion to the copper foil.

The photosensitive resin composition of the present invention can further incorporate therein a pH indicator which changes its color in an acidic range. As concrete examples of the pH indicator, methyl violet, methyl yellow, methyl orange, methyl red, 2,4-dinitrophenol, 2,6-dinitrophenol, thimol blue, Tropaeolin 00, bromophenol blue, and bromocresol green may be cited. When such a pH indicator is incorporated in the resin composition, the coating film has the color tone thereof altered by the acid generated in consequence of the exposure to the active energy ray to permit easy recognition of the alignment of the positions of the exposure in the substrate which has undergone the step of exposure. Thus, the pH indicator affords the advantage that the detection of rejectables can be easily attained prior to the step of development.

The positive type photosensitive resin composition of the present invention is enabled to form a tack-free coating film by a procedure which comprises applying the composition on a substrate by a suitable method such as the screen printing method and the roll coating method and exposing the resultant applied layer of the composition to an active energy ray having cut off by an optical filter the wavelength shorter than the threshold wavelength ($\lambda 1$) capable of activating the photo-acid generator (C) (primary irradiation) thereby inducing photo-radical polymerization of the compounds containing an ethylenically unsaturated bond.

Thereafter, by selectively irradiating the formed coating film with an active energy ray containing a wavelength for activating the photo-acid generator (C) through a photomask having a prescribed exposure pattern formed in advance therein (secondary selective exposure) and further heat-treating the coating film at about 60° C. to about 120° C. for 5 to 40 minutes, preferably for 70° C. to 100° C. for 10 to 20 minutes, the resinous compound containing the acid-decomposing ester group (A) mentioned above and the polymer of the compound containing one ethylenically unsaturated bond in its molecular and possessing a group capable of forming a carboxylic acid in consequence of decomposition by the action of an acid (B), which polymer has been produced by photo-radical polymerization in consequence of the primary exposure mentioned above, are thermally decomposed by the catalytic activity of the acid generated from the photo-acid generator (C) in consequence of the exposure to the active energy ray and rendered soluble in an aqueous alkaline solution in the part subjected to the secondary selective exposure. Subsequently, the positive resist pattern can be formed by dissolving and removing exclusively the part exposed to the active energy ray (the part subjected to the secondary selective exposure) in consequence of the development with an aqueous alkaline solution.

When the composition which has additionally incorporated therein the epoxy resin (E) is patterned as described above and then heat-treated at about 140° C. to about 180° C. for 15 to 120 minutes, it can form a resin insulating pattern excellent in heat resistance and electrical insulation properties because the photo-acid generator thermally decomposes and generates an acid and, by dint of this acid, the acid generated in consequence of the decomposition of the resinous compound (A) containing an acid-decomposing ester group and the acid generated by the decomposition of the polymer of the compound (B) resulting from the photo-cationic polymerization owing to the primary exposure or the acid generated by the thermal decomposition of the acid-decomposing ester itself undergo a cross-linking reaction with the epoxy resin.

When the positive type photosensitive resin composition of the present invention is to be used as an etching resist for the formation of a circuit pattern on a printed circuit board, it is first applied by a suitable method such as the screen printing method and roll coating method to a copper-clad laminate having through-holes perforated in advance therein, and the resultant applied layer of the resin composition is exposed to an active energy ray having cut off by an optical filter the wavelength shorter than the threshold wavelength ($\lambda 1$) capable of activating the photo-acid generator (C) to induce photo-radical polymerization of the compounds containing an ethylenically unsaturated bond and to produce a tack-free coating film. Thereafter, by selectively irradiating the formed coating film with an active energy ray containing a wavelength for activating the photo-acid generator (C) through a photomask having a prescribed exposure pattern formed in advance therein (secondary selective exposure) and further heat-treating the coating film at about 60° C. to about 140° C. for about 5 to about 60 minutes, preferably for about 80° C. to about 120° C. for about 5 to about 30 minutes, the resinous compound containing the acid-decomposing ester group (A) mentioned above and the polymer of the compound (B) are thermally decomposed by the catalytic activity of the acid generated from the photo-acid generator (C) in consequence of the exposure to the active energy ray in the part subjected to the secondary selective exposure. Subsequently, the positive resist pattern can be formed by dissolving and removing exclusively the part exposed to the active energy ray (the part subjected to the secondary selective exposure) in Consequence of the development with an aqueous alkaline solution. The resist film thus obtained can thoroughly withstand the acidic etching solution such as cupric chloride or ferric chloride which is used for etching the copper foil. By forming the positive resist pattern as described above, the etching resist can be left behind intact in such parts as the interiors of the through-holes which cannot be exposed to light.

The copper-clad laminate having the etching resist of a prescribed pattern formed on the surface thereof as described above is subsequently etched with such an acidic etching liquid as mentioned above to dissolve and remove the part of the copper foil from which the etching resist is absent and to form the circuit pattern aimed at.

When the resinous compound (A) mentioned above is the resin obtained by the reaction of a monovinyl ether compound with a polycarboxylic acid resin, after the formation of the circuit pattern, since the resinous compound (A) and the polymer of the compound (B) mentioned above are decomposed by the acid of the acidic etching liquid and the heat, it can be removed not only with such a strong aqueous alkaline solution as sodium hydroxide or potassium hydroxide but also with such a weak aqueous alkaline solution as sodium carbonate used in the development. In the manufacture of the multilayer printed circuit board, the step of the formation of the etching resist and the step of the formation of the circuit pattern mentioned above can be adopted after the resinous insulating layer and the conductor layer have been sequentially formed by any of the various well known methods and the multilayer printed circuit board of a required number of layers can be produced by repeating the steps mentioned above sequentially.

When the positive type photosensitive, thermosetting resin composition additionally incorporating the epoxy resin (E) therein is used for the production of an intermediate insulating layer in a multilayer printed circuit board, the composition is applied to a printed circuit board having circuits formed in advance therein and the applied layer of the composition formed consequently is irradiated with an active energy ray having cut off by an optical filter the wavelength shorter than the threshold wave length ($\lambda 1$) capable of activating the photo-acid generator (C) to form a tack-free coating film (primary irradiation). Subsequently, the parts of the coating film selected for the formation of via holes are exclusively irradiated selectively with an active energy ray containing a wavelength capable of activating the photo-acid generator (secondary selective exposure) and these parts are exclusively caused to generate an acid. When the coating film is further heat-treated at about 60° C. to about 120° C. for 5 to 40 minutes, preferably at 70° C. to 100° C. for 10 to 20 minutes and then developed with an aqueous alkaline solution, the resin composition in the via hole forming parts is dissolved and removed by the aqueous alkaline solution by the same action as mentioned above. When the development performed in one round fails to remove the resin composition to a target depth, the secondary selective exposure, the heat treatment, and the development mentioned above are to be repeated until perfect via holes are formed.

By the subsequent heat treatment performed at about 140° C. to about 180° C. for 15 to 120 minutes, the coating film is enabled to acquire fully satisfactory heat resistance and electrical insulation properties owing to the same action as mentioned above. Then, the coating film is subjected to electroless copper plating, electrolytic copper plating, and then etching by the use of an etching resist to form a circuit for the second layer. The reverse procedure of copper plating—etching—thermal curing may be alternatively adopted. A multilayer printed circuit board which has a desired number of layers can be manufactured by suquentially repeating the component steps of the procedure.

As the aqueous alkaline solution for the development of the coating film mentioned above, the aqueous solutions of such strong alkalis as sodium hydroxide and potassium hydroxide can be used. When the resinous compound (A) mentioned above is a polymer derived from a polycarboxylic acid, the weak aqueous alkaline solution containing sodium carbonate, potassium carbonate, sodium phosphate, sodium silicate, ammonia, or amines can be used.

As light sources for the irradiation of the active energy ray, it is appropriate to use a low-pressure mercury-vapor lamp, a medium-pressure mercury-vapor lamp, a high-pressure mercury-vapor lamp, an ultra-high-pressure mercury-vapor lamp, a xenon lamp, and a metal halide lamp, for example. A laser beam and an electron beam may be also utilizable as the active energy ray for the exposure.

Now, the present invention will be described specifically below by reference to working examples and comparative examples. Wherever "parts" and "%" are mentioned hereinafter, they are invariably based on weight unless otherwise specified.

SYNTHETIC EXAMPLE 1

In a flask equipped with a thermometer, a stirrer, a dropping funnel, and a reflux condenser, 362.7 parts of methyl isobutyl ketone and 11.5 parts of azobisisobutylonitrile were placed and heated to 75° C. To the hot mixture consequently formed, a mixed solution consisting of 72.0 parts of acrylic acid and 215.7 parts of methyl methacrylate was added dropwise over a period of three hours. Thereafter, the resultant mixture was further stirred for four hours to obtain a resin solution. The copolymer resin consequently obtained was found to have a weight average molecular weight of 16,000 and an acid value of 193 mg KOH/g.

This resin solution was cooled to room temperature and then caused to react with 150 parts of vinyl isobutyl ether added thereto at 50° C. for 50 hours. By testing the sample of the reaction product for acid value, it was confirmed that the vinyl isobutyl ether had been added to 95% of the carboxyl groups of the resin mentioned above. The reaction solution and 362.7 parts of acetyloxyethyl methacrylate added thereto were treated with an evaporator to expel the unaltered vinyl isobutyl ether and the methylisobutyl ketone as the solvent by evaporation and obtain a resin solution as a residue. This resin solution was labelled as "A-1 varnish".

SYNTHETIC EXAMPLE 2

In a flask equipped with a thermometer, a stirrer, a dropping funnel, and a reflux condenser, 362.7 parts of dipropylene glycol monomethyl ether and 11.5 parts of azobisisobutylonitrile were placed and heated to 75° C. To the hot mixture consequently formed, a mixed solution consisting of 72.0 parts of acrylic acid, 330 parts of methyl methacrylate, and 65.5 parts of 2-hydroxyethyl methacrylate was added dropwise over a period of three hours. Thereafter, the resultant mixture was further stirred for four hours to obtain a resin solution. The copolymer resin consequently obtained was found to have a weight average molecular weight of 21,000 and an acid value of 118 mg KOH/g.

This resin solution was cooled to room temperature and then caused to react with 150 parts of vinyl isobutyl ether added thereto at 50° C. for 30 hours. By testing the sample of the reaction product for acid value, it was confirmed that the vinyl isobutyl ether had been added to 85% of the carboxyl groups of the resin mentioned above. The reaction solution and 362.7 parts of acetyloxyethyl methacrylate added thereto were treated with an evaporator to expel the unaltered vinyl isobutyl ether and the dipropylene glycol monomethyl ether as the solvent for synthesis by evaporation and obtain a resin solution as a residue. This resin solution was labelled as "A-2 varnish".

SYNTHETIC EXAMPLE 3

In 280.4 parts of dipropylene glycol monomethyl ether, 320.6 parts of the half ester of a styrene-maleic anhydride resin having a weight average molecular weight of 2,500 and an acid value of 175 mg KOH/g (manufactured by Arco Chemical Compnay and sold under the product code of "SMA-1440") was dissolved by heating.

This resin solution was cooled to room temperature and then caused to react with 200 parts of vinyl isobutyl ether added thereto at 50° C. for 100 hours. By testing the sample of the reaction product for acid value, it was confirmed that the vinyl isobutyl ether had been added to about 85% of the carboxyl groups of the resin. The reaction solution and 362.7 parts of acetyloxyethyl methacrylate added thereto were treated with an evaporator to expel the unaltered vinyl isobutyl ether and the dipropylene glycol monomethyl ether as the solvent for synthesis by evaporation and obtain a resin solution as a residue. This resin solution was labelled as "A-3 varnish".

SYNTHETIC EXAMPLE 4

In a flask equipped with a thermometer, a stirrer, a dropping funnel, and a reflux condenser, 362.7 parts of propylene glycol monomethyl ether acetate and 7.5 parts of azobisisobutylonitrile were placed and heated to 75° C. To the hot mixture consequently formed, a mixed solution consisting of 72.0 parts of acrylic acid and 300 parts of methyl methacrylate was added dropwise over a period of three hours. Thereafter, the resultant mixture was further stirred for four hours to obtain a resin solution. The copolymer resin consequently obtained was found to have a weight average molecular weight of 46,000 and an acid value of 150 mg KOH/g.

This resin solution was cooled to room temperature and then caused to react with 200 parts of vinyl isobutyl ether added thereto at 50° C. for 30 hours. By testing the sample of the reaction product for acid value, it was confirmed that the vinyl isobutyl ether had been added to 90% of the carboxyl groups of the resin mentioned above. The reaction solution and 362.7 parts of acetyloxyethyl methacrylate added thereto were treated with an evaporator to expel the unaltered vinyl isobutyl ether and the propylene glycol monomethyl ether acetate as the solvent for synthesis by evaporation and obtain a resin solution as a residue. This resin solution was labelled as "A-4 varnish".

SYNTHETIC EXAMPLE 5

In a flask equipped with a thermometer, a stirrer, a dropping funnel, and a reflux condenser, 210.0 parts of methyl isobutyl ketone and 210.0 parts of a phenol novokak resin (manufactured by Showa Highpolymer Co., Ltd. and sold under the product code of "BRG-558") were placed and dissolved therein by heating at 90° C.

This resin solution was cooled to room temperature and then caused to react with 400 parts of vinyl isobutyl ether added thereto at 60° C. for 80 hours. By testing the sample of the reaction product for acid value, it was confirmed that the vinyl isobutyl ether had been added to 93% of the phenolic hydroxyl groups of the resin. The reaction solution and 0.1 part of methoquinone and 213.2 parts of phenoxyethyl methacrylate added thereto were treated with an evaporator to expel the unaltered vinyl isobutyl ether and the methyl isobutyl ketone as the solvent by evaporation and obtain a resin solution as a residue. This resin solution was labelled as "A-5 varnish".

SYNTHETIC EXAMPLE 6

In a flask equipped with a thermometer, a stirrer, a dropping funnel, and a reflux condenser, 210.0 parts of diisobutyl ether and 240.0 parts of a cresol novokak resin (manufatured by Showa Highpolymer Co., Ltd. and sold under the product code of "CRG-951") were placed and dissolved therein by heating at 90° C.

This resin solution was cooled to room temperature and then caused to react with 80 parts of succinic anhydride in the presence of 5.0 parts of triphenyl phosphine added thereto at 80° C. for 10 hours to obtain a carboxyl group-containing cresol resin solution. This resin solution was cooled to 60° C. and then caused to react with 378 parts of vinyl cyclohexyl ether added thereto at 60° C. for 72 hours. By testing the sample of the reaction product for acid value, it was confirmed that the vinyl cyclohexyl ether had been added to 92% of the carboxyl groups of the resin. The reaction solution and 0.1 part of methoquinone and 203.2 parts of acetyloxy ethyl methacrylate added thereto were treated with an evaporator to expel the unaltered vinyl cyclohexyl ether and the diisobutyl ether as the solvent by evaporation and obtain a resin solution as a residue. This resin solution was labelled as "A-6 varnish".

SYNTHETIC EXAMPLE 7

In a flask equipped with a thermometer, a stirrer, a dropping funnel, and a reflux condenser, 108 parts of acrylic acid and 0.05 part of a polymerization inhibitor were placed. After 300 parts of vinyl isobutyl ether was added thereto, the flask was tightly sealed with a silicone stopper. Then, the reactants in the flask were left reacting at 50° C. for 30 hours. It was confirmed by measuring the resultant reaction solution for acid value that the vinyl isobutyl ether had been added to 99.7% of the carboxylic acid. This reaction product was cooled to room temperature and treated with an evaporator to expel the unaltered vinyl isobutyl ether by evaporation and obtain a target compound as a residue. This compound was labelled as "B-1 compound".

SYNTHETIC EXAMPLE 8

In a flask equipped with a thermometer, a stirrer, a dropping funnel, and a reflux condenser, 270 parts of mono (2-acryloyloxyethyl) hexaphthalic acid and 0.05 part of a polymerization inhibitor were placed. After 200 parts of vinyl isobutyl ether was added thereto, the flask was tightly sealed with a silicone stopper. Then, the reactants in the flask were left reacting at 50° C. for 50 hours. It was confirmed by measuring the resultant reaction solution for acid value that the vinyl isobutyl ether had been added to 99.7% of the carboxylic acid. This reaction product was cooled to room temperature and treated with an evaporator to expel the unaltered vinyl isobutyl ether by evaporation and obtain a target compound as a residue. This compound was labelled as "B-2 compound".

SYNTHETIC EXAMPLE 9

In a flask equipped with a thermometer, a stirrer, a dropping funnel, and a reflux condenser, 284 parts of mono (2-methacryloyloxyethyl) hexaphthalic acid and 0.05 part of a polymerization inhibitor were placed. After 200 parts of vinyl isobutyl ether was added thereto, the flask was tightly sealed with a silicone stopper. Then, the reactants in the flask were left reacting at 50° C. for 50 hours. It was confirmed by measuring the resultant reaction solution for acid value that the vinyl isobutyl ether had been added to 99.7% of the carboxylic acid. This reaction product was cooled to room temperature and treated with an evaporator to expel the unaltered vinyl isobutyl ether by evaporation and obtain a target compound as a residue. This compound was labelled as "B-3 compound".

EXAMPLE 1

A positive type photosensitive resin composition was obtained by kneading the following components including A-1 varnish and B-1 compound obtained respectively in Synthetic Example 1 and Synthetic Example 7 with a three-roll mill.

| | |
|---|---|
| A-1 varnish | 100 parts |
| B-1 compound | 20 parts |
| Lucirin TPO (radical polymerization initiator manufactured by BASF) | 5 parts |
| Phthalocyanine blue | 0.5 part |
| UVI-6950 (photo-acid generator manufactured by Union Carbide) | 6 parts |
| Silicone-based anti-foaming agent | 1 part |
| Barium sulfate | 30 parts |
| Finely divided silica | 1 part |
| Methyl red | 0.2 part |
| Total | 163.7 parts |

EXAMPLE 2

A positive type photosensitive resin composition was obtained by kneading the following components including A-2 varnish and B-1 compound obtained respectively in Synthetic Example 2 and Synthetic Example 7 with a three-roll mill.

| | |
|---|---|
| A-2 varnish | 100 parts |
| B-1 compound | 20 parts |
| Lucirin TPO | 5 parts |
| Phthalocyanine blue | 0.5 part |
| UVI-6950 | 6 parts |
| Anthracene | 0.5 part |
| Silicone-based anti-foaming agent | 1 part |
| Barium sulfate | 30 parts |
| Finely divided silica | 1 part |
| Total | 164.0 parts |

EXAMPLE 3

A positive type photosensitive resin composition was obtained by kneading the following components including A-3 varnish and B-2 compound obtained respectively in Synthetic Example 3 and Synthetic Example 8 with a three-roll mill.

| | |
|---|---|
| A-3 varnish | 100 parts |
| B-2 compound | 20 parts |
| Lucirin TPO | 5 parts |
| Irgacure 819 (radical polymerization initiator manufactured by Ciba Specialty Chemicals Co.) | 1 part |
| Phthalocyanine blue | 0.5 part |
| UVI-6970 (photo-acid generator manufactured by Union Carbide) | 6 parts |
| Silicone-based anti-foaming agent | 1 part |
| Barium sulfate | 30 parts |
| Finely divided silica | 1 part |
| Total | 164.5 parts |

EXAMPLE 4

A positive type photosensitive resin composition was obtained by kneading the following components including A-4 varnish and B-2 compound obtained respectively in Synthetic Example 4 and Synthetic Example 8 with a three-roll mill.

| | |
|---|---|
| A-4 varnish | 100 parts |
| B-2 compound | 20 parts |
| Lucirin TPO | 5 parts |
| Irgacure 819 | 1 part |
| Phthalocyanine blue | 0.5 part |
| 2(2'-Furylethylidene)-4,6-bis(trichloromethyl)-S-triazine | 6 parts |
| Silicone-based anti-foaming agent | 1 part |
| Barium sulfate | 30 parts |
| Finely divided silica | 1 part |
| Total | 164.5 parts |

EXAMPLE 5

A positive type photosensitive resin composition was obtained by kneading the following components including A-1 varnish and B-3 compound obtained respectively in Synthetic Example 1 and Synthetic Example 9 with a three-roll mill.

| | |
|---|---|
| A-1 varnish | 100 parts |
| B-3 compound | 20 parts |
| Lucirin TPO | 5 parts |
| Irgacure 651 (radical polymerization initiator manufactured by Ciba Specialty Chemicals Co.) | 1 part |
| UV Blue 236 (blue dye manufactured by Mitsui-Toatsu Senryo K.K.) | 0.2 part |
| SP-150 (photo-acid generator manufactured by Asahi Denka K.K.) | 6 parts |
| Finely divided silica | 2 parts |
| Methyl yellow | 0.1 part |
| Total | 134.3 parts |

EXAMPLE 6

A positive type photosensitive, thermosetting resin composition was obtained by kneading the following components including A-1 varnish and B-2 compound obtained respectively in Synthetic Example 1 and Synthetic Example 8 with a three-roll mill.

| | |
|---|---|
| A-1 varnish | 100 parts |
| B-2 compound | 25 parts |
| Lucirin TPO | 5 parts |
| Phthalocyanine green | 0.5 part |
| UVI-6950 | 6 parts |
| Silicone-based anti-foaming agent | 1 parts |
| Methyl red | 0.2 part |
| Barium sulfate | 10 parts |
| TEPIC-H (epoxy resin manufactured by Nissan Chemicals Industries, Ltd.) | 25 parts |
| Finely divided silica | 1 part |
| Total | 173.7 parts |

EXAMPLE 7

A positive type photosensitive, thermosetting resin composition was obtained by kneading the following components including A-5 varnish and B-2 compound obtained respectively in Synthetic Example 5 and Synthetic Example 8 with a three-roll mill.

| | |
|---|---|
| A-5 varnish | 100 parts |
| B-2 compound | 25 parts |
| Lucirin TPO | 5 parts |
| Phthalocyanine green | 0.5 part |
| UVI-6950 | 6 parts |
| Anthracene | 0.5 part |
| Silicone-based anti-foaming agent | 1 part |
| 2MZ-OK (imidazole salt manufactured by Shikoku Kasei Kogyo K.K.) | 0.2 part |
| Barium sulfate | 5 parts |
| TEPIC-H | 35 parts |
| YX-4000 (epoxy resin manufatured by Yuka-Shell Epoxy K.K.) | 5 parts |
| Finely divided silica | 1 part |
| Total | 184.2 parts |

EXAMPLE 8

A positive type photosensitive, thermosetting resin composition was obtained by kneading the following components including A-6 varnish and B-3 compound obtained respectively in Synthetic Example 6 and Synthetic Example 9 with a three-roll mill.

| | |
|---|---|
| A-6 varnish | 100 parts |
| B-3 compound | 20 parts |
| Lucirin TPO | 5 parts |
| Irgacure 819 | 1 part |
| Phthalocyanine green | 0.5 part |
| UVI-6970 | 6 parts |
| Silicone-based anti-foaming agent | 1 part |
| Barium sulfate | 5 parts |
| TEPIC-H | 30 parts |
| YX-4000 | 10 parts |
| Finely divided silica | 1 part |
| Total | 179.5 parts |

COMPARATIVE EXAMPLE 1

In a flask equipped with a thermometer, a stirrer, a dropping funnel, and a reflux condenser, 362.7 parts of dipropylene glycol monomethyl ether and 11.5 parts of azobisisobutylonitrile were placed and heated to 75° C. To the hot mixture consequently formed, a mixed solution consisting of 72.0 parts of acrylic acid, 330 parts of methyl methacrylate, and 65.5 parts of 2-hydroxyethyl methacrylate was added dropwise over a period of three hours. Thereafter, the resultant mixture was further stirred for four hours to obtain a resin solution. The copolymer resin consequently obtained was found to have a weight average molecular weight of 21,000 and an acid value of 118 mg KOH/g.

This resin solution was cooled to room temperature and then caused to react with 150 parts of vinyl isobutyl ether added thereto at 50° C. for 30 hours. By testing the sample of the reaction product for acid value, it was confirmed that the vinyl isobutyl ether had been added to 85% of the carboxyl groups of the resin mentioned above. The reaction solution was treated with an evaporator to expel the unaltered vinyl isobutyl ether by evaporation. The resultant resin solution was labelled as "C-1 varnish".

A solvent-dry type and positive type photosensitive resin composition was obtained by kneading the following components including C-1 varnish with a three-roll mill.

| | |
|---|---|
| C-1 varnish | 200 parts |
| Phthalocyanine blue | 0.5 part |
| SP-150 | 6 parts |
| Silicone-based anti-foaming agent | 1 part |
| Barium sulfate | 30 parts |
| Finely divided silica | 1 part |
| Diethylene glycol monomethyl ether acetate | 10 parts |
| Total | 248.5 parts |

COMPARATIVE EXAMPLE 2

In 280.4 parts of dipropylene glycol monomethyl ether, 320.6 parts of the half ester of a styrene-maleic anhydride resin having a weight average molecular weight of 2,500 and an acid value of 175 mg KOH/g (manufactured by Arco Chemical Compnay and sold under the product code of "SMA-1440") was dissolved by heating. The resultant resin solution was labelled as "C-2 varnish".

A solvent-dry type and negative type photosensitive resin composition was obtained by kneading the following components including C-2 varnish with a three-roll mill.

| | |
|---|---|
| C-2 varnish | 108 parts |
| Dipentaerythritol hexaacrylate | 25 parts |
| Trimethylol propane EO-modified triacrylate | 10 parts |
| Phthalocyanine blue | 0.5 part |
| Irgacure 907 (Radical polymerization initiator manufactured by Ciba Specialty Chemicals Co.) | 5 parts |
| Diethyl thioxanthon | 1 part |
| Silicon-based anti-foaming agent | 1 part |
| Barium sulfate | 30 parts |
| Finely divided silica | 1 part |
| Diethylene glycol monomethyl ether acetate | 10 parts |
| Total | 191.5 parts |

COMPARATIVE EXAMPLE 3

A solvent-dry type and positive type photosensitive resin composition was obtained by kneading the following components including C-1 varnish obtained in Comparative Example 1 with a three-roll mill.

| | |
|---|---|
| C-1 varnish | 200 parts |
| Phthalocyanine green | 0.6 part |
| Dicyandiamide | 0.5 part |
| SP-150 | 6 parts |
| Silicone-based anti-foaming agent | 1 part |
| Barium sulfate | 10 parts |
| TEPIC-H | 25 parts |
| Finely divided silica | 1 part |
| Diethylene glycol monomethyl ether acetate | 10 parts |
| Total | 254.1 parts |

Evaluation of Performance (1) Finger-touch Dryness

The samples of the photosensitive resin compositions of Examples 1–5 and the photosensitive, thermosetting resin compositions of Examples 6–8 were each applied to the entire surface of a copper-clad substrate by the screen printing method. By the use of an ultraviolet light conveyor exposure device (metal halide lamp) fitted with an ultraviolet light cut filter L-37 (manufactured by Kenko K.K.), the applied layer of sample was dried by exposing the total surface thereof to a permeating light of L-37 mentioned above under the conditions of 80 W and 3.5 m/sec. The sample of the photosensitive resin composition of Comparative Example 1 was applied to the entire surface of a copper-clad substrate by the screen printing method and the applied layer was dried by heating at 80° C. for 20 minutes. The coated surfaces of substrates were tested for finger-touch dryness and rated on the following three-point scale.

○: Absolute absence of tackiness
Δ: Presence of only slight tackiness
×: Presence of tackiness (2) Ratio of Decrease of Weight by Drying The samples of the resin compositions obtained in Examples 1–8 and Comparative Examples 1–3 were each applied to a glass sheet and the applied layers were dried under the same conditions as in the test for finger-touch dryness indicated in (1) above. The samples were weighed before and after the drying and the ratios of decrease of weight by drying were calculated in accordance with the following formula:

Ratio of decrease of weight by drying (%)=$(W_1-W_2)/(W_1-W_0) \times 100$ wherein
$W_0$: Weight of sample before application (glass sheet alone)
$W_1$: Weight of sample after application (total weight of glass sheet and photosensitive resin composition before drying)
$W_2$: Weight of sample after drying (total weight of glass sheet and photosensitive resin composition after drying)

(3) Developing Property

The samples of the resin compositions obtained in Examples 1–8 and Comparative Examples 1–3 were each applied to the entire surface of a printed circuit board bearing a formed circuit by the screen printing method and the applied layers were dried under the same conditions as in the test for finger-touch dryness indicated in (1) above. A positive film was applied to each of the coated substrates and then the applied layers were exposed to light under the conditions of exposed dose of 500 mJ/cm². Thereafter, the irradiated layers were heat-treated at 90° C. for 20 minutes and developed for one minute with an aqueous 1 wt. % $Na_2CO_3$ solution sprayed under a pressure of 2 kg/cm to form a resist pattern and manufacture a substrate for rating. The developing property was rated on the following three-point scale.

○: Complete development
Δ: Slightly incomplete development
×: Absolute absence of development (4) Resistance to the Action of Etching The plates for rating manufactured as described above were kept immersed for 10 minutes in an etching liquid composed of 340 g/liter of cupric chloride and 51.3 g/liter of free hydrochloric acid at a liquid temperature of 50° C. After the immersion, the plates were visually examined to determine separation of resist film and rated on the following three-point scale.

○: Total absence of separation
Δ: Presence of slight separation
×: Presence of separation (5) Peeling Property 1

The plates for rating manufactured as described above were kept immersed for two minutes in an aqueous 2 wt. % NaOH solution at a temperature of 50° C. After the immersion, they were visually examined to determine the resist films for removability and peeling property on the following three-point scale.

○: Total absence of residue
Δ: Presence of slight residue
×: Presence of residue of resist film on the entire surface (6) Peeling Property 2

The plates for rating manufactured as described above were subjected to an etching treatment at 50° C. for two minutes by the use of an etching machine containing an etching liquid composed of 340 g/liter of cupric chloride and 51.3 g/liter of free hydrochloric acid. The substrates were passed through a developing device under the same conditions as mentioned above, i.e. using an aqueous 1 wt. % $Na_2CO_3$ solution and a spray pressure of 2 kg/cm². The plates were visually examined to test the resist film for removability and peeling property and rated on the following three-point scale.

○: Total absence of residue
Δ: Presence of slight residue
×: Presence of residue of resist film on the entire surface The results of these tests are shown in Table 1.

TABLE 1

| Properties | Example 1 | 2 | 3 | 4 | 5 | 6 | 7 | 8 | Comparative Example 1 | 2 | 3 |
|---|---|---|---|---|---|---|---|---|---|---|---|
| Finger-touch dryness | ○ | ○ | ○ | ○ | ○ | ○ | ○ | ○ | ○ | ○ | ○ |
| Ratio of decrease of weight (%) by drying | 2.3 | 2.5 | 1.9 | 2.0 | 2.1 | less than 1% | less than 1% | less than 1% | 42.4 | 35.9 | 32 |
| Developing property | ○ | ○ | ○ | ○ | ○ | ○ | Δ | ○ | ○ | ○ | ○ |
| Resistance to the action of etching | ○ | ○ | ○ | ○ | ○ | ○ | ○ | ○ | ○ | ○ | ○ |
| Peeling property 1 | ○ | ○ | ○ | ○ | ○ | ○ | ○ | ○ | ○ | ○ | ○ |
| Peeling property 2 | ○ | ○ | ○ | ○ | ○ | ○ | ○ | ○ | ○ | X | X |

It is clearly noted from Table 1 that the photosensitive resin compositions according to the present invention showed highly satisfactory peeling property in the aqueous alkali solution. It was found that they could be removed with an aqueous weak alkaline solution after the etching treatment with an acidic etching liquid.

(7) Resistance to the Heat of Soldering

The samples of the photosensitive, thermosetting resin compositions obtained in Examples 6–8 and Comparative Example 3 were each applied to the entire surface of a printed circuit board having a circuit formed in advance thereon in a layer thickness of about 20 μm by the screen printing method and processed to form a resist pattern under the same conditions as in the test for developing property indicated in (3) above. The substrates were thermally cured at 150° C. for 60 minutes to manufacture the plates for rating.

The plates for rating which were coated with a rosin-based flux were kept immersed for 30 seconds in a soldering bath set in advance at 260° C., washed with isopropyl alcohol to remove the flux, and visually examined to rate the resist layers for swelling, peeling, and discoloration on the following four-point scale.

⊙: Total absence of discernible change

○: Only slightly discernible change

Δ: Not more than 20% of swelling and peeling of the resist layer observed x: Not less than 20% of swelling and peeling of the resist layer observed (8) Insulating Properties By the use of a comb-type electrode B coupon of IPC B-25, plates for rating were manufactured under the same conditions as described above. The initial value of insulation resistance was measured by applying a bias of DC 500 V to the comb-type electrode.

The results of these tests are shown in Table 2.

TABLE 2

| Properties | Example 6 | 7 | 8 | Comparative Example 3 |
|---|---|---|---|---|
| Resistance to the heat of soldering | ○ | ○ | ○ | ○ |
| Insulation resistance (Ω) | $1.2 \times 10^{14}$ | $5.6 \times 10^{14}$ | $4.8 \times 10^{14}$ | $4.8 \times 10^{14}$ |

The data given in Table 2 clearly indicates that the use of photosensitive, thermosetting resin compositions according to the present invention permitted formation of resin insulating patterns excelling in resistance to the heat of soldering and electrical insulation properties without entailing any volume shrinkage after drying.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A method for forming a resist pattern, comprising:

a step of applying to a substrate a photosensitive resin composition comprising (A) a resinous compound containing an acid-decomposing ester group and possessing a weight average molecular weight in the range of 1,000 to 50,000, (B) a compound containing one ethylenically unsaturated bond in its molecule and possessing a group capable of forming a carboxylic acid via decomposition by the action of an acid, (C) a compound capable of generating an acid by exposure to an active energy ray, and (D) a photo-radical polymerization initiator, a primary exposure step of irradiating the applied layer with an active energy ray of a wavelength enough to activate said photo-radical polymerization initiator (D) and not enough to activate said compound (C) thereby radically polymerizing said compound (B) and consequently forming a tack-free coating film, a selective secondary exposure step of selectively irradiating said tack-free coating film with an active energy ray of a wavelength enough to activate said compound (C) thereby decomposing said compound (C) present in the irradiated part and inducing generation of an acid, a heating step for heating the coating film resulting from said selective secondary exposure step thereby decomposing said resinous compound (A) and the polymer of said compound (B) which are present in said part subjected to said selective secondary exposure and rendering the coating film in said part soluble in an aqueous alkaline solution, and a step of developing said coating film with an aqueous alkaline solution subsequently to said heating step thereby removing the part of said coating film subjected to said selective secondary exposure.

2. A method for forming a resist pattern, comprising:

a step of applying to a substrate a photosensitive resin composition comprising (A) a resinous compound containing an acid-decomposing ester group and possessing a weight average molecular weight in the range of 500 to 40,000, (B) a compound containing one ethylenically unsaturated bond in its molecule and possessing a group capable of forming a carboxylic acid via decomposition by the action of an acid, (C) a compound capable of generating an acid by exposure to an active energy ray, (D) a photo-radical polymerization initiator, and (E) an epoxy resin, a primary exposure step of irradiating the applied layer with an active energy ray of a wavelength enough to activate said photo-radical polymerization initiator (D) and not enough to activate said compound (C) thereby radically polymerizing said compound (B) and consequently forming a tack-free coating film, a selective secondary exposure step of selectively irradiating said tack-free coating film with an active energy ray of a wavelength enough to activate said compound (C) thereby decomposing said compound (C) present in the irradiated part and inducing generation of an acid, a heating step for heating the coating film resulting from said selective secondary exposure step thereby decomposing said resinous compound (A) and the polymer of said compound (B) which are present in said part subjected to said selective secondary exposure and rendering the coating film in said part soluble in an aqueous alkaline solution, a step of developing said coating film with an aqueous alkaline solution subsequently to said heating step thereby removing the part of said coating film subjected to said selective secondary exposure, and a step of heat-treating the coating film subsequently to said treatment of development thereby thermally curing said coating film.

* * * * *